(12) United States Patent
Chu et al.

(10) Patent No.: US 11,957,025 B2
(45) Date of Patent: Apr. 9, 2024

(54) TOUCH DISPLAY PANEL AND METHOD FOR MANUFACTURING SAME, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Zhiwen Chu, Beijing (CN); Bo Zhang, Beijing (CN); Hongwei Ma, Beijing (CN); Qian Ma, Beijing (CN); Tingliang Liu, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/765,402

(22) PCT Filed: May 6, 2021

(86) PCT No.: PCT/CN2021/091909
§ 371 (c)(1),
(2) Date: Mar. 30, 2022

(87) PCT Pub. No.: WO2022/007492
PCT Pub. Date: Jan. 13, 2022

(65) Prior Publication Data
US 2023/0142449 A1  May 11, 2023

(30) Foreign Application Priority Data
Jul. 6, 2020  (CN) .......................... 202010643081.2

(51) Int. Cl.
G06F 3/041 (2006.01)
H10K 59/40 (2023.01)
(Continued)

(52) U.S. Cl.
CPC ......... *H10K 59/40* (2023.02); *H10K 59/8731* (2023.02); *H10K 71/60* (2023.02)

(58) Field of Classification Search
CPC .... H10K 59/40; H10K 59/8731; H10K 71/60; H10K 71/00; H10K 50/844;
(Continued)

(56) References Cited

U.S. PATENT DOCUMENTS

2015/0242053 A1* 8/2015 Gao .................... G06F 3/04186
345/178
2018/0019288 A1* 1/2018 Yang ................... H01L 27/1255
(Continued)

FOREIGN PATENT DOCUMENTS

| CN | 107464828 A | 12/2017 |
| CN | 108649133 A | 10/2018 |

(Continued)

*Primary Examiner* — Thuy N Pardo
(74) *Attorney, Agent, or Firm* — IPro, PLLC

(57) ABSTRACT

Provided is a touch display panel. The touch display panel includes a drive back plate; a light-emitting device, disposed on the drive back plate; an encapsulation layer, disposed on a side of the light-emitting device distal from the drive back plate; and a touch layer, disposed on a side of the encapsulation layer distal from the light-emitting device, wherein the touch layer includes a first touch electrode layer and a second touch electrode layer laminated in sequence, and the touch layer further includes a touch insulating layer.

20 Claims, 5 Drawing Sheets

(51) Int. Cl.
*H10K 59/80* (2023.01)
*H10K 71/60* (2023.01)

(58) Field of Classification Search
CPC ......... G06F 2203/04103; G06F 3/0445; G06F 3/0412; G06F 3/04164
USPC ........................................ 345/173, 205, 207
See application file for complete search history.

(56) References Cited

U.S. PATENT DOCUMENTS

| | | | |
|---|---|---|---|
| 2018/0035372 A1* | 2/2018 | Pradas | H04W 76/28 |
| 2018/0039372 A1* | 2/2018 | Cho | H05K 5/03 |
| 2018/0088718 A1* | 3/2018 | Liu | G06F 3/0412 |
| 2018/0342700 A1* | 11/2018 | Cai | H10K 59/1213 |
| 2019/0245161 A1 | 8/2019 | Lee et al. | |
| 2020/0033978 A1* | 1/2020 | Xiang | G06F 3/0443 |
| 2020/0194721 A1* | 6/2020 | Lee | H10K 59/40 |
| 2020/0350512 A1* | 11/2020 | Guo | H10K 59/12 |
| 2020/0379602 A1* | 12/2020 | Zeng | G06V 40/1318 |
| 2021/0066655 A1 | 3/2021 | Jiang et al. | |
| 2022/0102689 A1 | 3/2022 | Jiang et al. | |
| 2022/0416206 A1* | 12/2022 | Yun | H10K 59/124 |

FOREIGN PATENT DOCUMENTS

| | | |
|---|---|---|
| CN | 210379052 U | 4/2020 |
| CN | 210429887 U | 4/2020 |
| CN | 111524908 A | 8/2020 |
| CN | 111796718 A | 10/2020 |
| IN | 110518043 A | 11/2019 |
| IN | 112151445 A | 12/2020 |

\* cited by examiner

TOUCH DISPLAY PANEL AND METHOD FOR MANUFACTURING SAME, AND DISPLAY DEVICE

CROSS-REFERENCE TO RELATED APPLICATION

This application is a U.S. national stage of international application No. PCT/CN2021/091909, filed on May 6, 2021, which claims priority to the Chinese Patent Application No. 202010643081.2, filed on Jul. 6, 2020 and entitled "TOUCH DISPLAY PANEL AND METHOD FOR MANUFACTURING SAME, AND DISPLAY DEVICE," the disclosures of which are incorporated herein by reference in their entireties.

TECHNICAL FIELD

The present disclosure relates to the field of display technologies, and more particularly to a touch display panel and a method for manufacturing the same, and a display device.

BACKGROUND

With the rapid change of display screens, a touch structure of a touch sensor panel (TSP) may be designed by a flexible multi-layer on cell (FMLOC) process. In an OLED display panel adopting the FMLOC technology, a touch electrode layer is manufactured on an encapsulation layer of the OLED display panel, so as to perform touch control without an external TSP.

A touch display panel includes a drive back plate, an encapsulation layer and a touch layer covering the drive back plate. The touch layer is disposed on a side of the encapsulation layer distal from the drive back plate. When the touch layer is formed, the encapsulation layer may be damaged, resulting in poor protection performance of the encapsulation layer.

SUMMARY

Embodiments of the present disclosure provide a touch display panel and a method for manufacturing the same, and a display device. Technical solutions are as follows.

According to an aspect of the present disclosure, a touch display panel is provided. The touch display panel includes:
  a drive back plate;
  a light-emitting device, disposed on the drive back plate;
  an encapsulation layer, disposed on a side of the light-emitting device distal from the drive back plate; and
  a touch layer, disposed on a side of the encapsulation layer distal from the light-emitting device, wherein the touch layer includes a first touch electrode layer and a second touch electrode layer laminated in sequence, and the touch layer further includes a touch insulating layer disposed between the first touch electrode layer and the second touch electrode layer and/or between the first touch electrode layer and the encapsulation layer, wherein a smallest space between a boundary of the drive back plate and at least portion of a boundary, most proximal to the boundary of the drive back plate, of the touch insulating layer is smaller than a smallest space between the boundary of the drive back plate and a boundary, most proximal to the boundary of the drive back plate, of the encapsulation layer.

Optionally, the touch insulating layer includes a first insulating layer and a second insulating layer, wherein the first insulating layer is disposed between the first touch electrode layer and the second touch electrode layer, the second insulating layer is disposed between the first touch electrode layer and the encapsulation layer, and a boundary of the second insulating layer is substantially flush with a boundary of the first insulating layer.

Optionally, the drive back plate includes a fan-out area, and a boundary of the first insulating layer proximal to the fan-out area is a first boundary; and
  a distance between each boundary, other than the first boundary, of the first insulating layer and a corresponding boundary of the encapsulation layer is a first specified distance.

Optionally, a distance between the first boundary of the first insulating layer and the boundary of the encapsulation layer is a second specified distance, and the second specified distance is greater than the first specified distance.

Optionally, the second specified distance is greater than or equal to 9 times the first specified distance.

Optionally, the encapsulation layer includes a first inorganic encapsulation layer and an organic encapsulation layer laminated on the first inorganic encapsulation layer; wherein a boundary of the organic encapsulation layer is within a region enclosed by a boundary of the first inorganic encapsulation layer; and
  the boundary of the encapsulation layer is the boundary of the first inorganic encapsulation layer.

Optionally, the encapsulation layer further includes a second inorganic encapsulation layer disposed on a side of the organic encapsulation layer distal from the first inorganic encapsulation layer; wherein a boundary of the second inorganic encapsulation layer is substantially flush with the boundary of the first inorganic encapsulation layer; and the boundary of the encapsulation layer is the boundary of the first inorganic encapsulation layer and the boundary of the second inorganic encapsulation layer.

Optionally, the touch display panel includes a first dam structure disposed on the drive back plate, wherein the first dam structure surrounds a display area of the touch display panel, the first inorganic encapsulation layer covers the first dam structure, and the organic encapsulation layer is disposed on a side of the first dam structure distal from the boundary of the drive back plate.

Optionally, the touch display panel includes a second dam structure disposed on the drive back plate, wherein the second dam structure surrounds the first dam structure; and
  the boundary of the touch insulating layer is disposed between the second dam structure and the boundary of the drive back plate.

Optionally, the drive back plate includes a plurality of inorganic insulating layers, wherein at least one layer of the plurality of inorganic insulating layers is provided with a plurality of grooves proximal to the boundary of the drive back plate and surrounding the second dam structure, and each of the grooves is extended along an extending direction of the boundary of the drive back plate.

Optionally, the encapsulation layer is formed by a top face, a bottom face and a side face, and the touch insulating layer covers the top face and the side face.

Optionally, a material of the first insulating layer and a material of the second insulating layer both include an inorganic material.

Optionally, the material of the first insulating layer includes silicon nitride, and the material of the second insulating layer includes silicon oxide.

According to another aspect of the present disclosure, a method for manufacturing a touch display panel is provided. The method includes:

providing a drive back plate;

forming a light-emitting device on the drive back plate;

forming an encapsulation layer on a side of the light-emitting device distal from the drive back plate; and forming a touch layer on a side of the encapsulation layer distal from the light-emitting device, wherein the touch layer is disposed on the side of the encapsulation layer distal from the light-emitting device, the touch layer includes a first touch electrode layer and a second touch electrode layer laminated in sequence, and the touch layer further includes a touch insulating layer, wherein the touch insulating layer is disposed between the first touch electrode layer and the second touch electrode layer and/or between the first touch electrode layer and the encapsulation layer, and a smallest space between a boundary of the drive back plate and at least portion of a boundary, most proximal to the boundary of the drive back plate, of the touch insulating layer is smaller than a smallest space between the boundary of the drive back plate and a boundary, most proximal to the boundary of the drive back plate, of the encapsulation layer.

Optionally, the touch insulating layer includes a first insulating layer and a second insulating layer; and forming the touch layer on the side of the encapsulation layer distal from the light-emitting device includes:

forming a first insulating material film layer on the side of the light-emitting device distal from the drive back plate;

forming the first touch electrode layer on the drive back plate formed with the first insulating material film layer;

forming a second insulating material film layer on the drive back plate formed with the first touch electrode layer;

performing a patterning process on the second insulating material film layer and the first insulating material film layer, to form the first insulating layer from the second insulating material film layer, and form the second insulating layer from the first insulating material film layer; and forming the second touch electrode layer on the first insulating layer.

According to still another aspect of the present disclosure, a touch display device is provided. The touch display device includes the touch display panel described above.

BRIEF DESCRIPTION OF THE DRAWINGS

In order to describe the technical solutions in the embodiments of the present more clearly, the following briefly introduces the accompanying drawings required for describing the embodiments. Apparently, the accompanying drawings in the following description show merely some embodiments of the present disclosure, and persons of ordinary skill in the art may still derive other drawings from these accompanying drawings without creative efforts.

Specific embodiments of the present disclosure have been shown through the above-mentioned drawings, and will be described in more detail hereinafter. These drawings and written descriptions are not intended to limit the scope of concepts of the present disclosure in any way, but merely describe the concepts of the present disclosure to those skilled in the art with reference to certain embodiments.

DETAILED DESCRIPTION

Embodiments of the present disclosure are described in further detail with reference to the accompanying drawings, to clearly present the objects, technical solutions, and advantages of the present disclosure.

Figure 1:
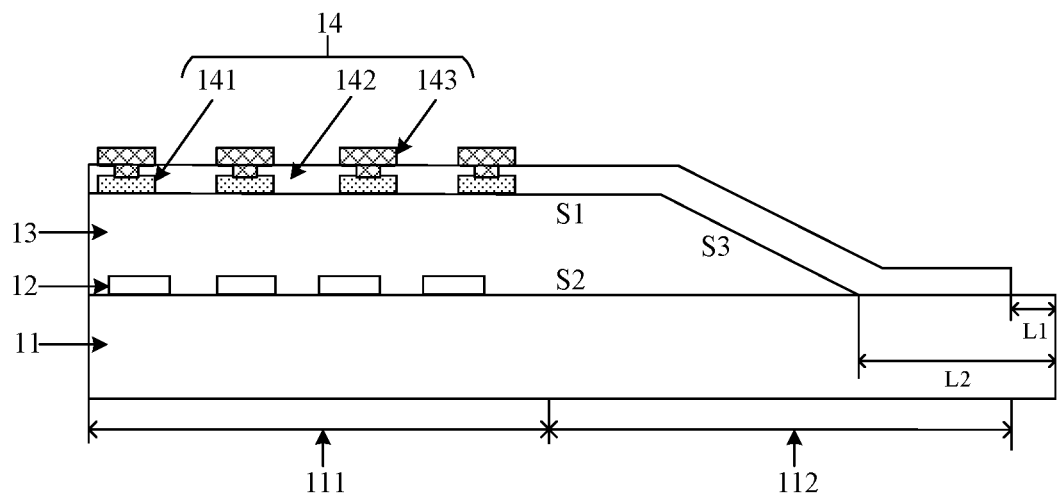
FIG. 1 is a schematic structural diagram of a touch display panel according to an embodiment of the present disclosure.

FIG. 1 is a schematic structural diagram of a touch display panel according to an embodiment of the present disclosure. As shown in FIG. 1, the touch display panel includes a drive back plate 11, a light-emitting device 12, an encapsulation layer 13 and a touch layer 14. The light-emitting device 12 is disposed on the drive back plate 11, and the encapsulation layer 13 is disposed on a side of the light-emitting device 12 distal from the drive back plate 11.

The touch layer 14 is disposed on a side of the encapsulation layer 13 distal from the light-emitting device 12, and the touch layer 14 includes a first touch electrode layer 141 and a second touch electrode layer 143 laminated in sequence. The first touch electrode layer 141 is disposed on the side of the encapsulation layer 13 distal from the light-emitting device 12, and the second touch electrode layer 143 is disposed on a side of the first touch electrode layer 141 distal from the encapsulation layer 13. The touch layer 14 further includes a touch insulating layer 142 disposed between the first touch electrode layer 141 and the second touch electrode layer 143 and/or between the first touch electrode layer 141 and the encapsulation layer 13. The smallest space L1 between a boundary of the drive back plate 11 and at least portion of the boundary, most proximal to the boundary of the drive back plate 11, of the touch insulating layer 142 is smaller than the smallest space L2 between the boundary of the drive back plate 11 and a boundary, most proximal to the boundary of the drive back plate 11, of the encapsulation layer 13.

That is, there is a certain distance between an orthographic projection of the at least portion of the boundary of the touch insulating layer 142 on the drive back plate 11 and an orthographic projection of the boundary of the encapsulation layer 13 on the drive back plate 11.

"And/or" described above may include three circumstance. In the first circumstance as shown in FIG. 1, the touch insulating layer 142 is disposed between the first touch electrode layer 141 and the second touch electrode layer 143.

Figure 2:
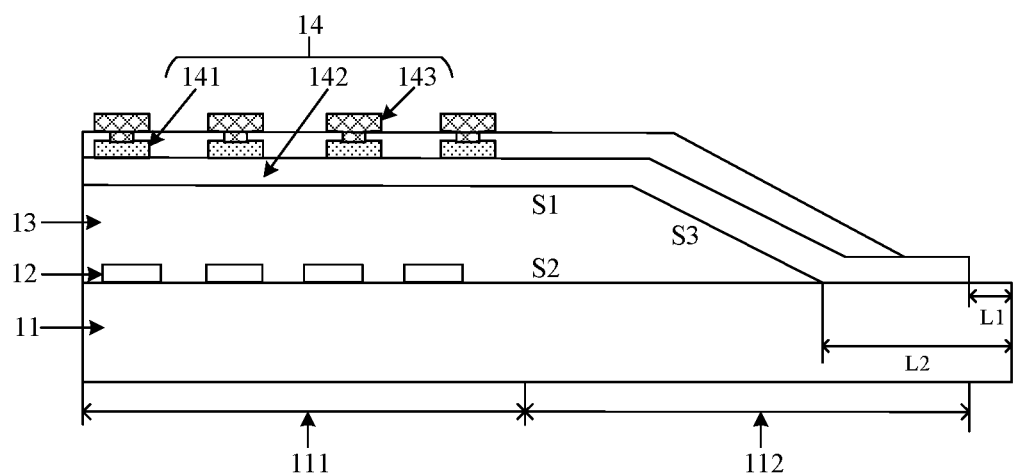
FIG. 2 is a schematic structural diagram of another touch display panel according to an embodiment of the present disclosure.

In the second circumstance as shown in FIG. 2, which is a schematic structural diagram of another touch display panel according to an embodiment of the present disclosure, the touch insulating layer 142 is disposed between the first touch electrode layer 141 and the encapsulation layer 13.

Figure 3:
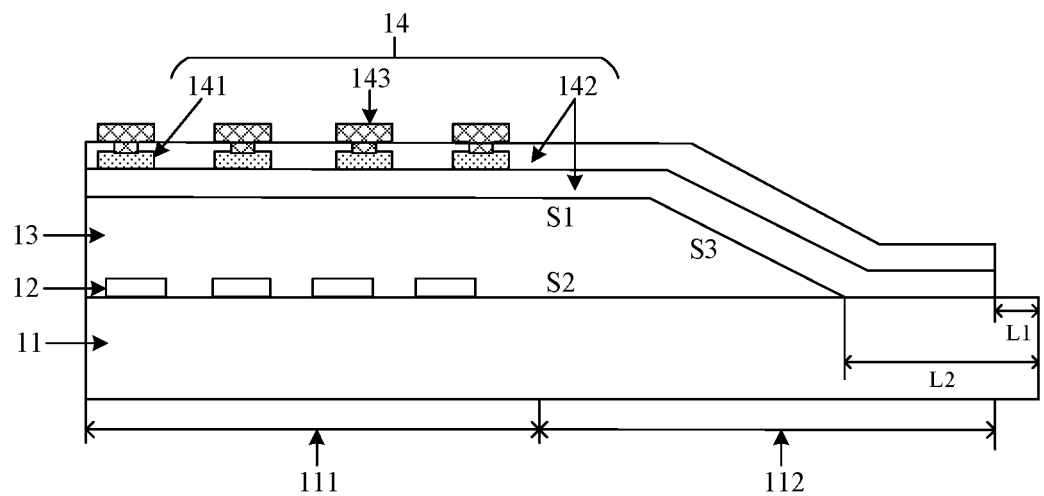
FIG. 3 is a schematic structural diagram of another touch display panel according to an embodiment of the present disclosure.

In the third circumstance as shown in FIG. 3, which is a schematic structural diagram of another touch display panel according to an embodiment of the present disclosure, the touch insulating layer 142 is disposed between the first touch electrode layer 141 and the second touch electrode layer 143, and the touch insulating layer 142 is disposed between the first touch electrode layer 141 and the encapsulation layer 13.

As shown in FIG. 1, the touch insulating layer 142 covers the encapsulation layer 13, and the smallest space L1 between the boundary of the drive back plate 11 and at least portion of the boundary, most proximal to the boundary of the drive back plate 11, of the touch insulating layer 142 is smaller than the smallest space L2 between the boundary of the drive back plate 11 and the boundary, most proximal to the boundary of the drive back plate 11, of the encapsulation layer 13. In this structure, when the touch insulating layer 142 is formed by a patterning process, the encapsulation layer 13 is not provided at the position, corresponding to the boundary of the touch insulating layer 142. Thus, the encapsulation layer 13 is not damaged, which can ensure a good encapsulation effect of the encapsulation layer 13.

In summary, the embodiments of the present disclosure provide a touch display panel including a drive back plate, a light-emitting device, an encapsulation layer and a touch layer. The touch insulating layer in the touch layer covers the encapsulation layer, and the smallest space between the boundary of the drive back plate and at least portion of the boundary, most proximal to the boundary of the drive back plate, of the touch insulating layer is smaller than the smallest space between the boundary of the drive back plate and the boundary, most proximal to the boundary of the drive back plate, of the encapsulation layer, which can prevent the encapsulation layer from being damaged in the process of forming the touch insulating layer. Therefore, the encapsulation effect of the encapsulation layer can be improved. The present disclosure solves the problem of relatively poor protection performance of the encapsulation layer caused by damage to the encapsulation layer in the process of forming the touch layer in the prior art.

Figure 4:
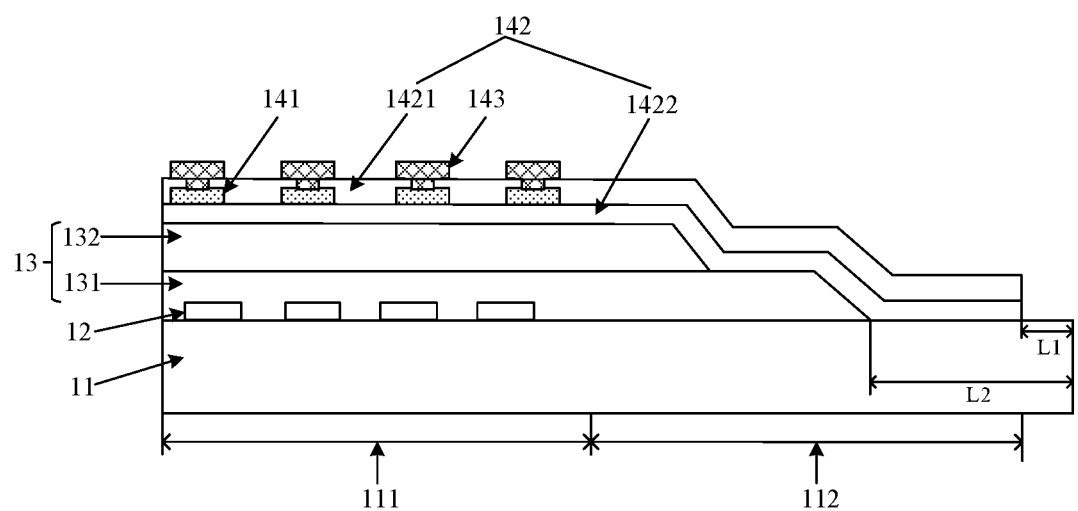
FIG. 4 is a schematic structural diagram of another touch display panel according to an embodiment of the present disclosure.

Optionally, FIG. 4 is a schematic structural diagram of another touch display panel according to an embodiment of the present disclosure. As shown in FIG. 4, the touch insulating layer 142 includes a first insulating layer 1421 and a second insulating layer 1422. The first insulating layer 1421 is disposed between the first touch electrode layer 141 and the second touch electrode layer 143, the second insulating layer 1422 is disposed between the first touch electrode layer 141 and the encapsulation layer 13, and the boundary of the second insulating layer 1422 is substantially flush with the boundary of the first insulating layer 1421. The second insulating layer 1422 may be a single-layer structure or a multi-layer structure.

A one-time patterning process may be performed on the first insulating layer 1421 and the second insulating layer 1422 simultaneously. In the embodiments of the present disclosure, the patterning process may include photoresist coating, exposure, development, etching and photoresist stripping. In this way, procedures of the one-time patterning process may be saved, thereby improving the production efficiency and saving cost.

In this way, the boundary of the second insulating layer 1422 and the boundary of the first insulating layer 1421 are substantially flush with each other (the boundaries being substantially flush may refer to that the boundary of the first insulating layer 1421 and the boundary of the second insulating layer 1422 are similar in shape and flush with each other within a certain range), that is, the smallest space L1 between the boundary of the drive back plate 11 and at least portion of the boundary, most proximal to the boundary of the drive back plate 11, of each of the first insulating layer 1421 and the second insulating layer 1422 is smaller than the smallest space L2 between the boundary of the drive back plate 11 and the boundary, most proximal to the drive back plate 11, of the encapsulation layer 13. In this way, damage to the encapsulation layer 13 can be prevented during performing the patterning process on the first insulating layer 1421 and the second insulating, layer 1422, such that the encapsulation layer 13 has a good encapsulation effect.

Figure 5:
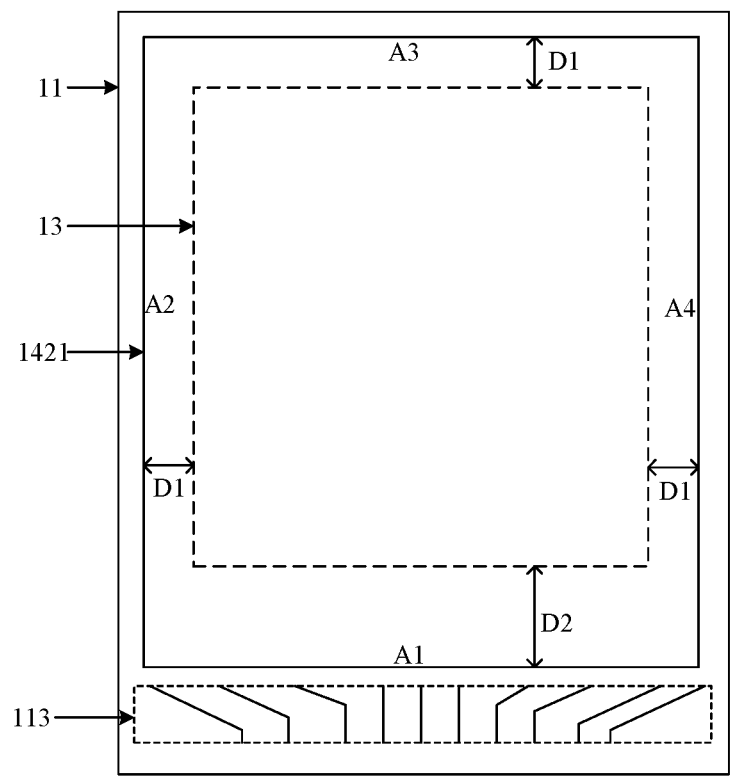
FIG. 5 is a schematic structural diagram of another touch display panel according to an embodiment of the present disclosure.

Optionally, FIG. 5 is a schematic structural diagram of another touch display panel according to an embodiment of the present disclosure. As shown in FIG. 5, the drive back plate 11 includes a fan-out area 113, and the boundary of the first insulating layer 1421 proximal to the fan-out area 113 is a first boundary A1. A drive circuit may be provided in the drive back plate 11 and the drive circuit is configured to for drive the light-emitting device to emit light. The fan-out area 113 refers to a region for disposing fan-out leads through which the drive circuit in the drive back plate 11 is connected to a drive chip.

The drive chip may be configured to provide signals for signal lines such as pixel circuits, and the fan-out area 113 may be provided with fan-out leads. The fan-out leads may be electrically connected to the drive chip and the drive circuit, so as to connect the drive circuit with the drive chip.

The distance between each boundary, other than the first boundary A1, of the first insulating layer 1421 (i.e., the second boundary A2, the third boundary A3 and the fourth boundary A4) and a corresponding boundary of the encapsulation layer 13 is a first specified distance D1.

Optionally, the distance between the first boundary A1 of the first insulating layer 1421 and the boundary of the encapsulation layer 13 is a second specified distance D2, and the second specified distance D2 is greater than the first specified distance D1.

Optionally, the second specified distance D2 is greater than or equal to 9 times the first specified distance D1. That is, the distance between the first boundary A1 and the boundary of the encapsulation layer 13 is much greater than the distance between any of the other boundaries of the first insulating layer 1421 and corresponding boundary of the encapsulation layer 13, such that a big distance may be left in the area proximal to the fan-out area 113 to avoid the encapsulation layer 13 from being affected.

Each of the first specified distance D1 and the second specified distance D2 may have a range. The first specified distance D1 may vary within the range of the first specified distance at different positions, and the second specified distance D2 may also vary within the range of the second specified distance at different positions.

Optionally, the first specified distance D1 may range from 2 μm to 35 μm, and the second specified distance D2 may be greater than or equal to 150 µm. In these distance range, the encapsulation layer 13 can be prevented from being damaged when the patterning process is performed on the first insulating layer 1421.

Generally, in the process of patterning the first insulating layer 1421, not only the film layer where the first insulating layer 1421 is disposed is etched, but also etching may continue to a certain depth, such that an adjacent process film layer (the encapsulation layer 13) is partially etched. Thus, the encapsulation layer 13 is damaged, which may result in encapsulation failure of the encapsulation layer 13, thereby resulting in growing dark spots (GDS) on the touch display panel. GDS is a phenomenon that the touch display panel is damaged, that is, dark spots are formed on the touch display panel. After the dark spots are formed, the dark spots gradually grow until the entire touch display panel fails.

Therefore, the certain distance between the boundary of the first insulating layer 1421 and the boundary of the encapsulation layer 13 can prevent the encapsulation layer 13 from being damaged in the patterning process of the first insulating layer 1421.

Optionally, as shown in FIG. 4, the encapsulation layer 13 includes a first inorganic encapsulation layer 131 and an organic encapsulation layer 132 laminated on the first inorganic encapsulation layer 131. The boundary of the organic encapsulation layer 132 is within a region enclosed by the boundary of the first inorganic encapsulation layer 131. The organic encapsulation layer 132 may be configured to achieve planarization, buffer the stress on the display panel during bending and folding, and cover particle contaminants. The organic encapsulation layer 132 may be made of a material such as acrylic fiber, hexamethyldisiloxane, polyacrylate, polycarbonate, and polystyrene. The material of the first inorganic encapsulation layer 131 may include silicon nitride, aluminum nitride, zirconium nitride, titanium nitride, hafnium nitride, tantalum nitride, silicon oxide, aluminum oxide, titanium oxide, tin oxide, cerium oxide, silicon nitrate, silicon oxynitride, and the like.

The boundary of the encapsulation layer 13 is the boundary of the first inorganic encapsulation layer 131, that is, there is a certain distance between an orthographic projection of the boundary of the first insulating layer 1421 on the drive back plate 11 and an orthographic projection of the boundary of the first inorganic encapsulation layer 131 on the drive back plate 11. In this way, damage to the first inorganic encapsulation layer 131 can be avoided during etching the first insulating layer 1421, such that the first inorganic encapsulation layer 131 has a good encapsulation effect.

Figure 6:
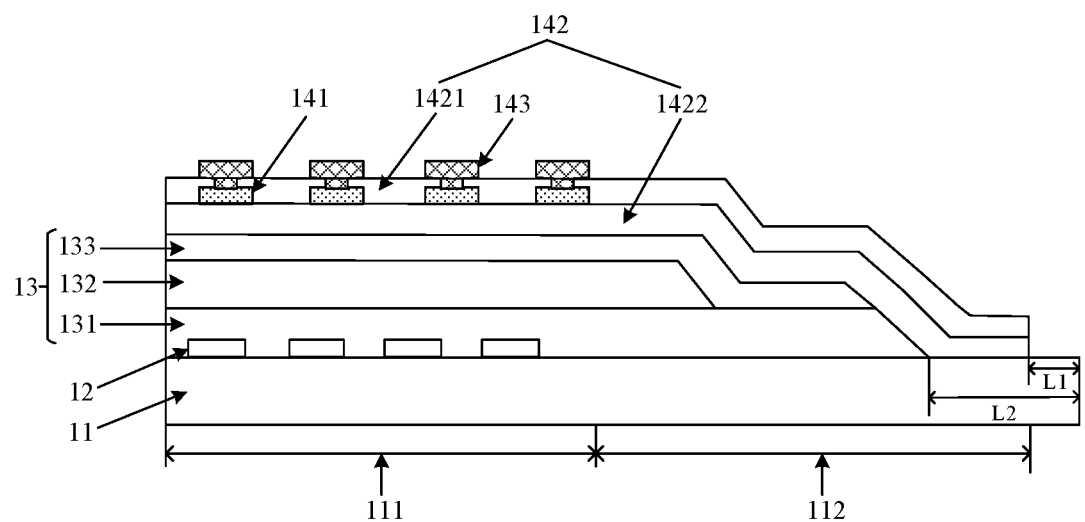
FIG. 6 is a schematic structural diagram of another touch display panel according to an embodiment of the present disclosure.

Optionally, FIG. 6 is a schematic structural diagram of another touch display panel according to an embodiment of the present disclosure. As shown in FIG. 6, the encapsulation layer 13 further includes a second inorganic encapsulation layer 133. The second inorganic encapsulation layer 133 is disposed on a side of the organic encapsulation layer 132 distal from the first inorganic encapsulation layer 131, that is, the second inorganic encapsulation layer 133 is disposed between the organic encapsulation layer 132 and the second insulating layer 1422. In addition, the boundary of the second inorganic encapsulation layer 133 is substantially flush with the boundary of the first inorganic encapsulation layer 131 (the boundaries being substantially flush may refer to that the boundary of the first inorganic encapsulation layer 131 and the boundary of the second inorganic encapsulation layer 133 are similar in shape and are flush with each other within a certain range), and the boundary of the encapsulation layer 13 is the boundary of the first inorganic encapsulation layer 131 and the boundary of the second inorganic encapsulation layer 133. Moreover, a one patterning process may be performed on the first inorganic encapsulation layer 131 and the second inorganic encapsulation layer 133 simultaneously, which may save procedures of the one-time patterning process, thereby improving production efficiency and saving costs. Thus, there is also a certain distance between the orthographic projection of the boundary of the first insulating layer 1421 on the drive back plate 11 and the orthographic projection of the boundary of the second inorganic encapsulation layer 133 on the drive back plate 11, such that damage to the second inorganic encapsulation layer 133 in the etching process of the first insulating layer 1421 can be avoided, and the second inorganic encapsulation layer 133 has a good encapsulation effect.

Figure 7:
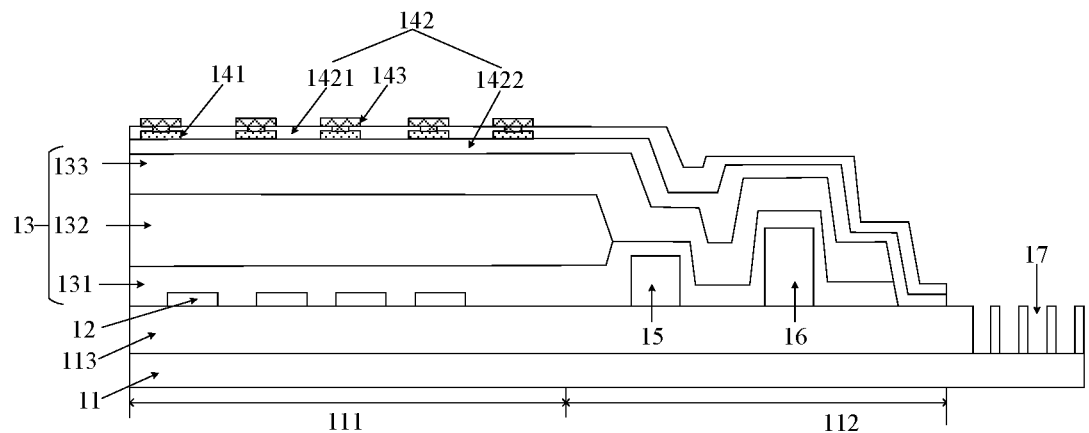
FIG. 7 is a schematic structural diagram of another touch display panel according to an embodiment of the present disclosure.

Optionally, FIG. 7 is a schematic structural diagram of another touch display panel according to an embodiment of the present disclosure. As shown in FIG. 7, the drive back plate 11 is provided with a display area 111 and an encapsulation area 112 surrounding the display area 111. The light-emitting device 12 is disposed in the display area 111 of the drive back plate 11.

The touch display panel includes a first dam structure 15 disposed on the drive back plate 11. The first dam structure 15 surrounds the display area of the touch display panel, and the display area of the touch display panel may include the display area 111 of the drive back plate 11. The first inorganic encapsulation layer 131 covers the first dam structure 15, and the organic encapsulation layer 132 is disposed on a side of the first dam structure 15 distal from the boundary of the drive back plate 11. The first dam structure 15 can limit the flowing area of the material with fluidity of the organic encapsulation layer 132. Therefore, the coverage area of the organic encapsulation layer 132 in the figure is smaller than that of the first inorganic encapsulation layer 131. The first dam structure 15 can prolong the intrusion path of water and oxygen, which can prevent the intrusion of water and oxygen, and further improve the encapsulation effect.

Optionally, as shown in FIG. 7, the touch display panel includes a second dam structure 16 disposed on the drive back plate 11, and the second dam structure 16 surrounds the first dam structure 15. The second dam structure 16 can also prolong the intrusion path of water and oxygen, which may prevent the intrusion of water and oxygen, and further improve the encapsulation effect. The boundary of the touch insulating layer 142 is disposed between the second dam structure 16 and the boundary of the drive back plate 11, such that a better encapsulation effect can be achieved.

Optionally, as shown in FIG. 7, the drive back plate 11 includes a plurality of inorganic insulating layers 113. At least one layer of the plurality of inorganic insulating layers 113 is provided with a plurality of grooves 17 proximal to the boundary of the drive back plate 11 and surrounding the second dam structure 16, and each groove 17 is extended along an extending direction of the boundary of the drive back plate 11.

The plurality of grooves can be configured to prevent cracks generated on the periphery of the touch display panel from extending to the display area of the touch display panel, thereby improving the protection effect on internal structures of the touch display panel.

Optionally, as shown in FIG. 1, the encapsulation layer 13 is formed by a top face S1, a bottom face S2 and a side face S3, and the touch insulating layer 142 covers the top face S1 and the side face S3. In this way, the touch insulating layer 142 can play a better effect of protecting on the encapsulation layer 13, thereby improving the encapsulation effect of the touch display panel.

Optionally, as shown in FIG. 4, each of the material of the first insulating layer 1421 and the material of the second insulating layer 1422 includes an inorganic material.

Optionally, the material of the first insulating layer 1421 may include silicon nitride. Silicon nitride is a structural ceramic material with properties of good hardness, wear-resistance, anti-oxidation at high temperatures and thermal shock resistance. This material does not break even when being subjected to rapid cooling after being heated to above 1000° C. in air and rapid heating again. The first insulating layer 1421 may have both an insulating property and an encapsulation property, so as to enhance the encapsulation property of the touch display panel. In addition, the material of the first insulating layer 1421 may further include silicon oxide, silicon oxynitride, aluminum oxide, aluminum nitride, titanium oxide, or titanium nitride, or the like, which is not limited in the embodiments of the present disclosure. The material of the second insulating layer 1422 may include silicon oxide, which is chemically stable and does not react with water. The second insulating layer 1422 may also play a certain encapsulation function.

Optionally, as shown in FIG. 6, the first touch electrode layer 141 and the second touch electrode layer 143 in the touch layer are both disposed in the display area 111, and the first insulating layer 1421 covers the display area 111 and the encapsulation area 112. The first inorganic encapsulation layer 131 and the second inorganic encapsulation layer 133 in the encapsulation layer 13 may cover the display area 111 and at least part of the encapsulation area 112, such that the encapsulation effect of the touch display panel can be enhanced.

Optionally, as shown in FIG. 4, the thickness of the first insulating layer 1421 may range from 0.3 µm to 0.4 µm. The first insulating layer 1421 with the thickness in the above range can have good insulating property and encapsulation properly, and can replace the topmost inorganic encapsulation layer in a traditional inorganic/organic/inorganic tri-layer encapsulation layer, such that the structure of the encapsulation layer may be simplified to be an inorganic/organic bilayer structure.

The thickness of the second insulating layer 1422 may range 0.4 µm to 0.6 µm. The second insulating layer 1422 with the thickness in the above range can achieve better insulation and encapsulation effects. An encapsulation thickness after the second insulating layer 1422 is combined with the first insulating layer 1421 may reach from 0.7 µm to 1 µm.

The thickness of the first inorganic encapsulation layer 131 may range from 0.8 µm to 1.2 µm, so that the total thickness of the encapsulation layer formed of the inorganic materials in the encapsulation area 112 may range from 1.5 µm to 2.2 µm, which can have a good barrier effect against water and oxygen, thereby achieving a better encapsulation effect. The thickness of the organic encapsulation layer 132 may range from 6 µm to 12 µm, which can effectively buffer the stress on the touch display panel during bending and folding. The organic encapsulation layer 132 may cover the display area 111 and at least part of the encapsulation area 112.

That is, four film layers, i.e., the second insulating layer 1422, the first inorganic encapsulation layer 131, the organic encapsulation layer 132 and the first insulating layer 1421 may play the function of encapsulation together, thereby achieving a better encapsulation effect on the touch display panel.

Alternatively, as shown in FIG. 6, five film layers, i.e., the second insulating layer 1422, the first inorganic encapsulation layer 131, the organic encapsulation layer 132, the second inorganic encapsulation layer 133 and the first insulating layer 1421 may play the function of encapsulation together, thereby achieving a better encapsulation effect on the touch display panel Optionally, the light-emitting device may emit light under the drive of the drive circuit of the drive back plate. The light-emitting device includes a first electrode layer and a second electrode layer facing each other, and a light-emitting layer disposed between the first electrode layer and the second electrode layer. The first electrode layer may be an anode layer, and the second electrode layer may be a full-surface cathode layer covering the light-emitting layer. The light-emitting layer may include a hole injection layer, a hole transport layer, a light-emitting material layer, an electron transport layer, and an electron injection layer sequentially laminated on the first electrode layer. In other embodiments, the light-emitting device may further include other functional layers, which are not listed here. In other embodiments, the film layers of the light-emitting device may not be provided or other film layers may be provided, and the film layers under the encapsulation layer are not specifically limited in the present disclosure.

Optionally, the touch layer may adopt a self-capacitance touch electrode or a mutual-capacitance touch electrode. The self-capacitance touch electrode is thinner in size and has smaller parasitic capacitance, and thus has a better touch effect and is easier to be fabricated into a thin size. In an embodiment, taking a self-capacitance touch electrode as an example, the touch layer in the present disclosure includes two touch electrode layers. One touch electrode layer may be a metal mesh layer, and the other touch electrode layer may be a bridging metal layer. The metal mesh layer includes a plurality of emission electrodes and a plurality of sensor electrodes disposed on the same layer, and the plurality of emission electrodes and the plurality of sensor electrodes are interlaced to form a mesh shape. The plurality of sensor electrodes are connected to each other in the present layer, the plurality of emission electrodes are bridged by a bridging metal layer, and the emission electrodes and the sensor electrodes are electrically insulated from each other. The first insulating layer is disposed between the two touch electrode layers, and vias are provided in the first insulating layer to implement the connection between the metal mesh and the bridging metal layer.

In other embodiments, one touch electrode layer may be configured as an emission electrode layer, and the other touch electrode layer may be configured as a sensor electrode layer, to form a mutual-capacitance touch electrode. The specific structure thereof is not repeated herein.

In summary, the embodiment of the present disclosure provides a touch display panel including a drive back plate, a light-emitting device, an encapsulation layer and a touch layer. The touch insulating layer in the touch layer covers the encapsulation layer, and the smallest space between the boundary of the drive back plate and at least portion of the boundary, most proximal to the boundary of the drive back plate, of the touch insulating layer is smaller than the smallest space between the boundary of the drive back plate and the boundary, most proximal to the boundary of the drive back plate, of the encapsulation layer, which can prevent the encapsulation layer from being damaged in the process of forming the touch insulating layer. Therefore, the encapsulation effect of the encapsulation layer can be improved. The present disclosure solves the problem of relatively poor protection performance of the encapsulation layer caused by damage to the encapsulation layer in the process of forming the touch layer in the prior art.

Figure 8:
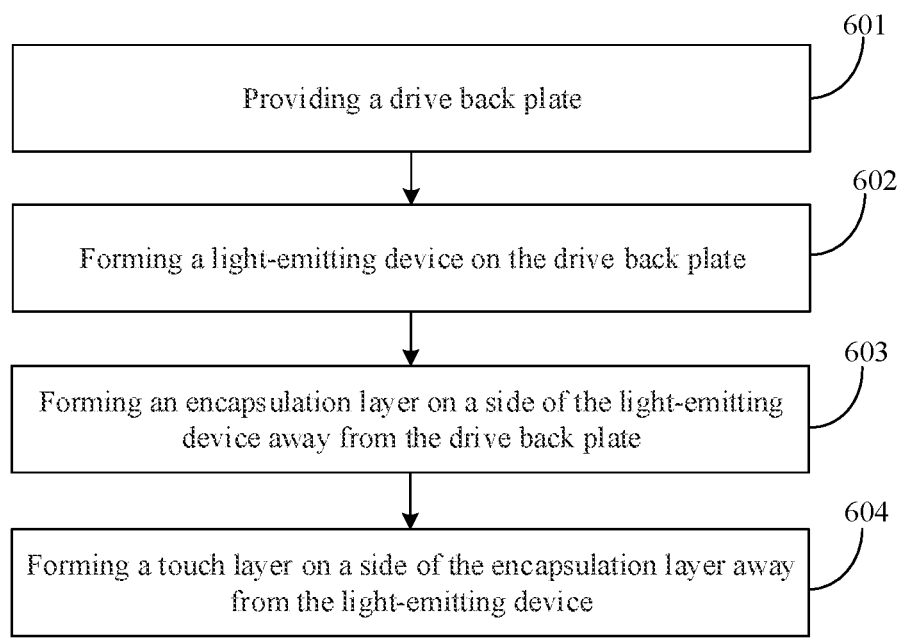
FIG. 8 is a flowchart of a method for manufacturing a touch display panel according to an embodiment of the present disclosure.

FIG. 8 is a flowchart of a method for manufacturing a touch display panel according to an embodiment of the present disclosure, and the method may be applied to manufacture the touch display panel shown in FIG. 1, FIG. 2 and FIG. 3. As shown in FIG. 8, the method may include the following steps:

In step 601, a drive back plate is provided.

In step 602, a light-emitting device is formed on the drive back plate.

In step 603, an encapsulation layer is formed on a side of the light-emitting device distal from the drive back plate.

In step 604, a touch layer is formed on a side of the encapsulation layer distal from the light-emitting device.

The touch layer 14 includes a first touch electrode layer 141 and a second touch electrode layer 143 laminated in sequence. The first touch electrode layer 141 is disposed on a side of the encapsulation layer 13 distal from the light-emitting device 12, and the second touch electrode layer 143 is disposed on a side of the first touch electrode layer 141 distal from the encapsulation layer 13. The touch layer 14 further includes a touch insulating layer 142 disposed between the first touch electrode layer 141 and the second touch electrode layer 143 and/or between the first touch electrode layer 141 and the encapsulation layer 13. The smallest space L1 between a boundary of the drive back plate 11 and at least portion of the boundary, most proximal to the boundary of the drive back plate 11, of the touch insulating layer 142 is smaller than the smallest space L2 between the boundary of the drive back plate 11 and the boundary, most proximal to the boundary of the drive back plate 11, of the encapsulation layer 13.

In summary, the embodiment of the present disclosure provides a method for manufacturing a touch display panel. The touch insulating layer in the touch layer covers the encapsulation layer, and the smallest space between the boundary of the drive back plate and at least portion of the boundary, most proximal to the boundary of the drive back plate, of the touch insulating layer is smaller than the smallest space between the boundary of the drive back plate and the boundary, most proximal to the boundary of the drive back plate, of the encapsulation layer, which can prevent the encapsulation layer from being damaged in the process of forming the touch insulating layer. Therefore, the encapsulation effect of the encapsulation layer can be improved. The present disclosure solves the problem of relatively poor protection performance of the encapsulation layer caused by damage to the encapsulation layer in the process of forming the touch layer in the prior art.

Figure 9:
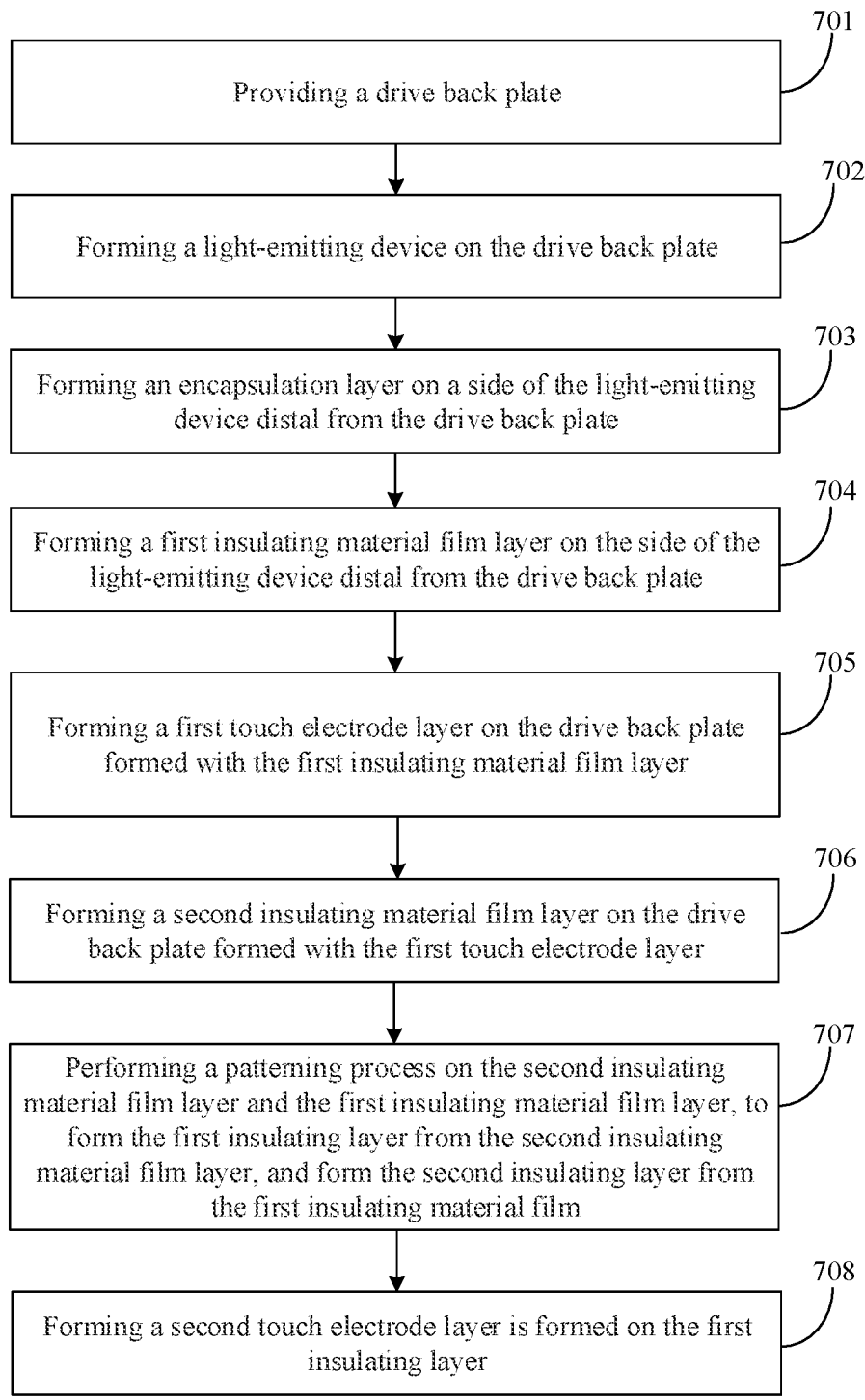
FIG. 9 is a flowchart of another method for manufacturing a touch display panel according to an embodiment of the present disclosure.

FIG. 9 is a flowchart of another method for manufacturing a touch display panel according to an embodiment of the present disclosure, and the method may be applied to manufacture the touch display panel shown in FIG. 6. As shown in FIG. 9, the method may include the following steps.

In step 701, a drive back plate is provided.

The drive back plate 11 is provided with a display area 111 and a peripheral area surrounding the display area, and the peripheral area includes an encapsulation area 112.

In step 702, a light-emitting device is formed on the drive back plate.

The light-emitting device 12 is disposed in the display area 111 of the drive back plate 11.

In step 703, an encapsulation layer is formed on a side of the light-emitting device distal from the drive back plate.

A first inorganic encapsulation layer 131, an organic encapsulation layer 132 and a second inorganic encapsulation layer 133 which are laminated are sequentially formed on a side of the light-emitting device 12 distal from the drive back plate 11, and the first inorganic encapsulation layer 131 and the second inorganic encapsulation layer 133 cover the display area. 111 and at least part of the encapsulation area 112, and the organic encapsulation layer 132 covers the display area 111 and at least part of the encapsulation area 112, so as to form the encapsulation layer 13. The boundary of the first inorganic encapsulation layer 131 is substantially flush with the boundary of the second inorganic encapsulation layer 133.

The first inorganic encapsulation layer 131 and the second inorganic encapsulation layer 133 may be formed by a chemical vapor deposition (CVD) process, a physical vapor deposition process or an evaporation process, and the organic encapsulation layer 132 may be formed by an inkjet printing process or a spraying process.

In step 704, a first insulating material film is formed on the side of the light-emitting device distal from the drive back plate.

The first insulating material film layer may be formed by a deposition process, such as chemical deposition or physical deposition.

In step 705, a first touch electrode layer is formed on the drive back plate formed with the first insulating material film layer.

The first touch electrode layer 141 may be made from at least one of metal materials such as copper, aluminum, molybdenum, and silver, which have relatively high conductivity. A full-surface film layer may be formed by magnetron sputtering and the like first, and then the metal film layer is patterned to form the first touch electrode layer 141. The patterning process may be a chemical wet etching method or an inkjet printing method.

In step 706, a second insulating material film layer is formed on the drive back plate formed with the first touch electrode layer.

The second insulating material film layer may be formed by a deposition process, such as chemical deposition or physical deposition.

In step 707, a patterning process is performed on the second insulating material film layer and the first insulating material film layer, to form the first insulating layer from the second insulating material film layer, and form the second insulating layer from the first insulating material film layer.

The first insulating material film layer and the second insulating material film layer may be patterned through a one-time patterning process, so that areas proximal to the boundary of the drive back plate 11 are etched away. The boundary of the first insulating layer 1421 and the boundary of the second insulating layer 1422 are substantially flush.

In the embodiment of the present disclosure, the patterning process may include steps such as photoresist coating, exposure, development, etching, and photoresist stripping.

Here, the smallest space between the boundary of the drive back plate 11 and at least portion of the boundary, most proximal to the boundary of the drive back plate 11, of the first insulating layer 1421 and the second insulating layer 1422 is smaller than the smallest space between the boundary of the drive back plate 11 and the boundary, most proximal to the boundary of the drive back plate 11, of each of the first inorganic encapsulation layer 131 and the second inorganic encapsulation layer 133.

It should be noted that, in this step, the first insulating material film layer and the second insulating material film layer are etched through the etching process in the patterning process, and the etching is performed on the boundary of the first insulating layer 1421 and the boundary of the second insulating layer 1422. Since there is a certain distance between the orthographic projection of the boundary of each of the first insulating layer 1421 and the second insulating layer 1422 on the drive back plate 11 and the orthographic projection of the boundary of the underlying encapsulation layer 13 on the drive back plate 11, and the distance is between the boundary of the encapsulation layer 13 and the boundary of the drive back plate 11, the encapsulation layer 13 is not damaged during the etching process.

In step 708, a second touch electrode layer is formed on the first insulating layer.

The second touch electrode layer 143 may be made from at least one of metal materials such as copper, aluminum, molybdenum, and silver, which have relatively high conductivity. A full-surface film layer may be formed by magnetron sputtering and the like first, and then the metal film layer is patterned to form the second touch electrode layer 143. The patterning process may be a chemical wet etching method or an inkjet printing method.

The first insulating layer 1421 disposed between the first touch electrode layer 141 and the second touch electrode layer 143 may be referred to as a touch layer dielectric (TLD) layer. The second insulating layer 1422 disposed between the first touch electrode layer 141 and the encapsulation layer 13 may be referred to as a barrier layer or a buffer layer.

In summary, the embodiment of the present disclosure provides a method for manufacturing a touch display panel. The touch insulating layer in the touch layer covers the encapsulation layer, and the smallest space between the boundary of the drive back plate and at least portion of the boundary, most proximal to the boundary of the drive back plate, of the touch insulating layer is smaller than the smallest space between the boundary of the drive back plate and the boundary, most proximal to the boundary of the drive back plate, of the encapsulation layer, which can prevent the encapsulation layer from being damaged in the process of forming the touch insulating layer. Therefore, the encapsulation effect of the encapsulation layer can be improved. The present disclosure solves the problem of relatively poor protection performance of the encapsulation layer caused by damage to the encapsulation layer in the process of forming the touch layer in the prior art.

An embodiment of the present disclosure further provides a touch display device. The touch display device includes the touch display panel in any of the above embodiments. The touch display device may be a mobile phone, a tablet computer, a TV, a notebook computer, a digital photo frame, a navigator, and any other products or components with display functions.

In the present disclosure, the terms "first", "second", "third" and "fourth" are merely used for the purpose of descriptions and should not be construed as indicating or implying relative importance. The term "a plurality of" refers to two or more, unless otherwise expressly specified.

The term "and/or" in the present disclosure is merely used to describe an association relationship among associated objects, and may indicate three relationships. For example, "A and/or B" may indicate that A exists alone, or A and B exist concurrently, or B exists alone.

It should be noted that in the accompanying drawings, for clarity of illustration, the dimension of the layers and areas may be scaled up. It may be understood that when an element or layer is described as being "on" another element or layer, the described element or layer may be directly on the other element or layer, or at least one intermediate layer may exist. In addition, it is to be understood that when an element or layer is described as being "under" another element or layer, the described element or layer may be directly under the other element or layer, or at least one intermediate layer may exist. It is to be further understood that when a layer or element is described as being arranged "between" two layers or elements, the described layer or element may be the only layer between the two layers or elements, or at least one intermediate layer or element may exist. In the whole specification described above, similar reference numerals denote similar elements.

The above descriptions are merely optional embodiments of the present disclosure, and are not intended to limit the present disclosure. Any modifications, equivalent substitutions, improvements, and the like made within the spirit and principles of the present disclosure shall be included in the protection scope of the present disclosure.

What is claimed is:

1. A touch display panel, comprising:
   a drive back plate;
   a light-emitting device, disposed on the drive back plate;
   an encapsulation layer, disposed on a side of the light-emitting device distal from the drive back plate; and
   a touch layer, disposed on a side of the encapsulation layer distal from the light-emitting device, wherein the touch layer comprises a first touch electrode layer and a second touch electrode layer laminated in sequence, and the touch layer further comprises a touch insulating layer disposed between the first touch electrode layer and the second touch electrode layer and/or between the first touch electrode layer and the encapsulation layer, wherein a smallest space between a boundary of the drive back plate and at least portion of a boundary, most proximal to the boundary of the drive back plate, of the touch insulating layer is smaller than a smallest space between the boundary of the drive back plate and a boundary, most proximal to the boundary of the drive back plate, of the encapsulation layer.

2. The touch display panel according to claim 1, wherein the touch insulating layer comprises a first insulating layer and a second insulating layer, wherein the first insulating layer is disposed between the first touch electrode layer and the second touch electrode layer, the second insulating layer is disposed between the first touch electrode layer and the encapsulation layer, and a boundary of the second insulating layer is substantially flush with a boundary of the first insulating layer.

3. The touch display panel according to claim 2, wherein the drive back plate comprises a fan-out area, and a boundary of the first insulating layer proximal to the fan-out area is a first boundary; and
   a distance between each boundary, other than the first boundary, of the first insulating layer and the corresponding boundary of the encapsulation layer is a first specified distance.

4. The touch display panel according to claim 3, wherein a distance between the first boundary of the first insulating layer and the corresponding boundary of the encapsulation layer is a second specified distance, the second specified distance being greater than the first specified distance.

5. The touch display panel according to claim 4, wherein the second specified distance is greater than or equal to 9 times the first specified distance.

6. The touch display panel according to claim 1, wherein the encapsulation layer comprises a first inorganic encapsulation layer and an organic encapsulation layer laminated on the first inorganic encapsulation layer; wherein
- a boundary of the organic encapsulation layer is within a region enclosed by a boundary of the first inorganic encapsulation layer; and
- the boundary of the encapsulation layer is the boundary of the first inorganic encapsulation layer.

7. The touch display panel according to claim 6, wherein the encapsulation layer further comprises a second inorganic encapsulation layer disposed on a side of the organic encapsulation layer distal from the first inorganic encapsulation layer; wherein
- a boundary of the second inorganic encapsulation layer is substantially flush with the boundary of the first inorganic encapsulation layer; and
- the boundary of the encapsulation layer is the boundary of the first inorganic encapsulation layer and the boundary of the second inorganic encapsulation layer.

8. The touch display panel according to claim 6, comprising a first dam structure disposed on the drive back plate, wherein the first dam structure surrounds a display area of the touch display panel, the first inorganic encapsulation layer covers the first dam structure, and the organic encapsulation layer is disposed on a side of the first dam structure distal from the boundary of the drive back plate.

9. The touch display panel according to claim 8, comprising a second dam structure disposed on the drive back plate, wherein
- the second dam structure surrounds the first dam structure; and
- the boundary of the touch insulating layer is disposed between the second dam structure and the boundary of the drive back plate.

10. The touch display panel according to claim 9, wherein the drive back plate comprises a plurality of inorganic insulating layers, wherein at least one layer of the plurality of inorganic insulating layers is provided with a plurality of grooves proximal to the boundary of the drive back plate and surrounding the second dam structure, and each of the grooves is extended along an extending direction of the boundary of the drive back plate.

11. The touch display panel according to claim 1, wherein the encapsulation layer is formed by a top face, a bottom face and a side face, and the touch insulating layer covers the top face and the side face.

12. The touch display panel according to claim 2, wherein a material of the first insulating layer and a material of the second insulating layer both comprise an inorganic material.

13. The touch display panel according to claim 12, wherein the material of the first insulating layer comprises silicon nitride, and the material of the second insulating layer comprises silicon oxide.

14. A touch display device, comprising the touch display panel according to claim 1.

15. The touch display device according to claim 14, wherein the touch insulating layer comprises a first insulating layer and a second insulating layer, wherein the first insulating layer is disposed between the first touch electrode layer and the second touch electrode layer, the second insulating layer is disposed between the first touch electrode layer and the encapsulation layer, and a boundary of the second insulating layer is substantially flush with a boundary of the first insulating layer.

16. The touch display device according to claim 15, wherein the drive back plate comprises a fan-out area, and a boundary of the first insulating layer proximal to the fan-out area is a first boundary; and
- a distance between each boundary, other than the first boundary, of the first insulating layer and the corresponding boundary of the encapsulation layer is a first specified distance.

17. The touch display device according to claim 16, wherein a distance between the first boundary of the first insulating layer and the corresponding boundary of the encapsulation layer is a second specified distance, the second specified distance being greater than the first specified distance.

18. The touch display device according to claim 17, wherein the second specified distance is greater than or equal to 9 times the first specified distance.

19. A method for manufacturing a touch display panel, comprising:
- providing a drive back plate;
- forming a light-emitting device on the drive back plate;
- forming an encapsulation layer on a side of the light-emitting device distal from the drive back plate; and
- forming a touch layer on a side of the encapsulation layer distal from the light-emitting device, wherein the touch layer is disposed on the side of the encapsulation layer distal from the light-emitting device, the touch layer comprises a first touch electrode layer and a second touch electrode layer laminated in sequence, and the touch layer further comprises a touch insulating layer, wherein the touch insulating layer is disposed between the first touch electrode layer and the second touch electrode layer and/or between the first touch electrode layer and the encapsulation layer, and a smallest space between a boundary of the drive back plate and at least portion of a boundary, most proximal to the boundary of the drive back plate, of the touch insulating layer is smaller than a smallest space between the boundary of the drive back plate and a boundary, most proximal to the boundary of the drive back plate, of the encapsulation layer.

20. The method according to claim 19, wherein the touch insulating layer comprises a first insulating layer and a second insulating layer; and
forming the touch layer on the side of the encapsulation layer distal from the light-emitting device comprises:
- forming a first insulating material film layer on the side of the light-emitting device distal from the drive back plate;
- forming the first touch electrode layer on the drive back plate formed with the first insulating material film layer;
- forming a second insulating material film layer on the drive back plate formed with the first touch electrode layer;
- performing a patterning process on the second insulating material film layer and the first insulating material film layer, to form the first insulating layer from the second insulating material film layer, and form the second insulating layer from the first insulating material film layer; and forming the second touch electrode layer on the first insulating layer.

\* \* \* \* \*